United States Patent
Vrijen

(10) Patent No.: US 7,041,514 B1
(45) Date of Patent: May 9, 2006

(54) INTEGRATED CIRCUIT REPAIR USING MULTIPLE-PHOTON ABSORPTION OF LASER LIGHT

(75) Inventor: Rutger B. Vrijen, San Mateo, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 71 days.

(21) Appl. No.: 10/672,539

(22) Filed: Sep. 26, 2003

(51) Int. Cl.
*H01L 21/66* (2006.01)

(52) U.S. Cl. .............................. 438/14; 438/16; 438/17; 438/18; 257/48

(58) Field of Classification Search .................. 438/14, 438/16–18, 128–132; 257/48, 529, 640
See application file for complete search history.

(56) References Cited

U.S. PATENT DOCUMENTS 5,729,041 A * 3/1998 Yoo et al. .................... 257/529
6,100,116 A * 8/2000 Lee et al. .................... 438/128

* cited by examiner

*Primary Examiner*—Dung A. Le
(74) *Attorney, Agent, or Firm*—Gunnison, McKay & Hodgson, L.L.P.; Philip J. McKay

(57) ABSTRACT

A method and apparatus provides the capability for activating, i.e., annealing or ablating, LASER activated fuses from the back-side of an integrated circuit chip using multiple-photon absorption techniques that allow the absorbed LASER energy to be highly localized in three dimensions. According to the invention, the photons from the LASER have an energy less than the band gap energy of the substrate material, therefore absorption in areas of the substrate other than the focal point is avoided. According to the invention, objects such as LASER activated fuses that lie either within the integrated circuit substrate, or on the opposite surface, i.e., the active surface, of the integrated circuit substrate can be accessed and activated by the LASER energy. Consequently, using the method of the invention, LASER activated fuses can be activated after the integrated circuit chip has been mounted in a flip-chip configuration and/or as part of a Multiple-Chip-Module.

13 Claims, 4 Drawing Sheets

US 7,041,514 B1

INTEGRATED CIRCUIT REPAIR USING MULTIPLE-PHOTON ABSORPTION OF LASER LIGHT

FIELD OF THE INVENTION

The present invention relates generally to integrated circuits and more particularly to integrated circuit repair using redundant components, LASER activated fuses, and multiple-photon absorption of LASER light.

BACKGROUND OF THE INVENTION

As the complexity of integrated circuits has continued to increase, the cost of fabrication of each individual integrated circuit has also increased. This is particularly true for complicated integrated circuits such as large memories and microprocessors. The cost of fabricating integrated circuits is a result of the fact that integrated circuit fabrication requires multiple complicated steps, significant amounts of special and expensive material, and very expensive and highly specialized equipment to apply the materials in precisely formed and etched layers.

In order to ensure a return on the investment of time, materials, and capital, required to produce each integrated circuit, it is important that a relatively large percentage of the integrated circuits created perform as expected without defects or flaws. However, because the fabrication of integrated circuits can be so complex, and because the process is so susceptible to contamination, thermal effects, and physical stress of any kind, defects are always present and there is often a significant number of defective integrated circuits fabricated that are simply non-usable. When this is the case, absent some other repair mechanism, all of the time, materials and investment made in the defective integrated circuits are simply wasted. The ratio of operational integrated circuits produced to total integrated circuits produced is called the yield of the process.

As a way of increasing the yield of a given process, many integrated circuit designers and manufacturers include special redundant "repair" circuitry that is formed at strategic locations on the integrated circuit. The purpose of the repair circuits is to provide redundant capability on the integrated circuit chip that can be accessed to replace circuitry and subsystems that fail to operate as specified. Consequently, using repair circuitry blocks, a failure of a single circuit or functional block of the integrated circuit does not necessitate throwing away the entire chip and starting over. Instead, the damaged portion of the integrated circuit can be bypassed and the repair circuitry accessed to take its place. This means that the integrated circuit can be salvaged and all of the resources used to create the integrated circuit can be saved. Of course, to effectively use the repair circuitry it is important that the defect be discovered as early as possible and under as realistic integrated circuit operational conditions as possible. Use of repair circuit blocks is well known in the art and has proven very effective at increasing process yield and keeping the cost of fabrication down.

In the prior art, one method for accessing the repair circuitry when it was needed was to include fuses that were either annealed (melted) or blown (ablated), collectively referred to herein as activated, to make or break electrical connections, provide access to the repair circuitry, and by-pass the faulty circuitry. In many instances, the fuses were annealed or blown by using LASER energy.

FIG. 1A shows a simplified perspective view of an integrated circuit chip 100. Integrated circuit chip 100 has an active side 111 and a backside 112. Active side 111 of integrated circuit chip 100 includes active surface 107 in which, and on which, the circuitry of integrated circuit chip 100 is formed. As shown in FIG. 1A active surface 107 lies in the plane 101 formed by axis 131, the Y-axis, and axis 133, the X-axis. As also shown in FIG. 1A, axis 135, the Z-axis, extends through integrated circuit chip 100 from active surface 107 to backside 112. A poly or other passivation layer 141 is formed over active surface 107 to protect active surface 107 from contamination and other environmental factors. Both passivation layer 141 and active surface 107 are situated on a substrate 103, typically silicon. Substrate 103, and therefore integrated circuit chip 100, also includes a backside surface 105.

FIG. 1B is overhead view of plane 101 formed by axis 131, the Y-axis, and axis 133, the X-axis, active side 111 of integrated circuit chip 100, and the various circuitry formed in active surface 107 including redundant repair circuitry block 110 and a LASER activated fuse 130 for electrically connecting redundant repair circuitry block 110 when it is needed.

According to prior art teachings, LASER activated fuses, such as LASER activated fuse 130, had to be activated, i.e., either annealed or blown, from active side 111 of integrated circuit chip 100 so that an optical path could be guaranteed for the LASER energy to access and focus on LASER activated fuse 130. FIG. 2 shows a simplified process for activating a LASER activated fuse, such as LASER activated fuse 130, as was necessitated by the prior art teachings. As shown in FIG. 2, an opening 253 in passivation layer 141 was required in the prior art to give LASER energy 251 from LASER 250 optically clear access to LASER activated fuse 130 on active surface 107 of active side 111 of integrated circuit 100.

In the prior art, LASER activated fuses could only be activated from the active side 111 of integrated circuit chip 100. This was because LASER energy 251 was typically generated such that LASER energy 251 was absorbed by substrate material 103, typically silicon. As a result, LASER energy 251 had to focus on a point, such as LASER activated fuse 130, located in the plane 101 formed by axis 131, the Y-axis, and axis 133, the X-axis (FIG. 1A and FIG. 1B). Consequently, in the prior art, LASER energy 251 had to have optically clear access to LASER activated fuse 130 on active surface 107 of active side 111 of integrated circuit 100. Importantly, using prior art methods, LASER activated fuse 130 could not be activated by LASER energy 251 from LASER 250 from backside 112 and backside surface 105 of integrated circuit 100 because the LASER energy 251 would be absorbed by substrate 103 of integrated circuit chip 100 and could not penetrate substrate 103 with any certainty or accuracy, or without creating unacceptable damage to substrate 103.

While using the prior art methods to activate LASER activated fuse 130 allowed many otherwise non-functional integrated circuit chips 100 to be repaired, the fact that, using prior art methods, LASER activated fuse 130 could not be activated by LASER energy 251 from backside 112 and backside surface 105 of integrated circuit 100 was a distinct disadvantage for several reasons. First, a large percentage of integrated circuits are now packaged using the well-known "flip-chip" mounting procedure wherein the active side 111 of integrated circuit chip 100 faces a mounting substrate and therefore active side 111, and LASER activated fuse 130, is not accessible once integrated circuit 100 is operationally mounted.

FIG. 3 shows a simplified flip-chip configuration of integrated circuit chip 100. As shown in FIG. 3, when mounted in a flip-chip configuration, active side 111 of integrated circuit chip 100 includes solder mounting bumps 303 that are coupled to mounting pads 305 that are formed on first surface 307 of mounting substrate 301. Mounting Pads 305 are, in turn, coupled to connection pads 309 on second surface 312 of mounting substrate 301. Connection pads 309 are then used to couple the structure of FIG. 3 to a motherboard or other larger unit. Flip-chip mounting of integrated circuits is well known to those of skill in the art. Consequently, a more detailed discussion of flip-chip mounting is excluded here to avoid detracting from the present invention.

Importantly, as shown in FIG. 3, once integrated circuit chip 100 is flip-chip mounted to mounting substrate 301, i.e., once integrated circuit chip 100 is operationally connected as it will be used in the field, there is no optically direct access to active side 111 of integrated circuit chip 100 or to active surface 107 and LASER activated fuse 130. Consequently, using prior art methods, LASER activated fuse 130 could not be activated once integrated circuit chip 100 was connected as it would be deployed. This meant that integrated circuit chip 100 could not be tested under its actual operating conditions and that special test equipment had to be used to try to find defects prior to mounting integrated circuit chip 100 because post-mounting defects could not be corrected, at least not without un-mounting and then re-mounting integrated circuit chip 100. Of course, un-mounting and then re-mounting integrated circuit chip 100 was very expensive and often resulted in causing more damage to integrated circuit chip 100 and/or introduced more contamination to the unit. In addition, with Multi-Chip Modules (MCMs) the process was even more burdensome and inefficient.

Testing integrated circuit chip 100 prior to mounting integrated circuit chip 100 in a flip-chip configuration meant that integrated circuit chip 100 could typically not be observed under realistic operating conditions, i.e., at realistic speeds and under realistic operating thermodynamics, since the actual connections that would be used in the field would not have been made and integrated circuit chip 100 would not be in its integrated circuit package.

In addition, testing integrated circuit chip 100 prior to mounting integrated circuit chip 100, as required by the prior art methods, meant that any contamination and/or defects from the packaging/mounting process would be introduced after testing and could not be repaired. Consequently, in this event, not only would the cost of integrated circuit chip 100 be wasted but the cost of further testing and processing of integrated circuit chip 100 and the packaging of integrated circuit chip 100 would also be wasted.

In addition, as noted above, testing integrated circuit chip 100 prior to mounting integrated circuit chip 100, as required in the prior art, meant the purchase and use of special test equipment (not shown) that could make temporary signal connections and at least partially test integrated circuit chip 100 to try to find defects prior to mounting. To make matters worse, connecting and disconnecting integrated circuit chip 100 to the special test equipment could itself cause damage to integrated circuit chip 100 or introduce contamination.

In short, using prior art methods, it was possible that an integrated circuit chip, such as integrated circuit chip 100, would be at least partially tested prior to flip-chip mounting and a defect could be found and even repaired using the prior art LASER methods described above prior to mounting.

Using prior art methods, the integrated circuit chip could then be mounted and packaged only to find that a defect, either undetected under the simulated conditions of the test equipment, or created during the testing/mounting/packaging process, was present and could not be repaired because there was no active side access to the integrated circuit. Consequently, all the time, materials and energy involved in making the integrated circuit chip, making the repair circuitry, testing the integrated circuit chip, repairing a first defect in the integrated circuit chip and packaging the integrated circuit chip would be wasted. In this instance, the manufacturer would have been better off not having repair circuits and simply discarding the integrated circuit chip when the first error was found in order to cut losses.

As discussed above, the fact that, using prior art methods, once integrated circuit chip 100 was flip-chip mounted to mounting substrate 301, i.e., once integrated circuit chip 100 was operational connected as it would be used, LASER activated fuse 130 could not be activated meant that many of the advantages of having repair circuitry 110 in the first place were negated, and that many otherwise repairable integrated circuits 100 were wasted because they could not be repaired after mounting. This was particularly unfortunate because flip-chip mounting has become very commonplace, both to package individual integrated circuits 100 and in MCMs. In addition, when MCMs are employed, the individual integrated circuit chips making up the MCM must electrically communicate with each other for proper unit operation. However, using prior art methods, the integrated circuits chips had to be tested individually prior to mounting in the MCM. Consequently, not only was there an inability to test the integrated circuit chips under operation conditions, but a failure of one chip meant that multiple integrated circuit chips, and all the resources expended to make them and the MCM package, could potentially be wasted.

What is needed is a method for activating LASER activated fuses from the backside of an integrated circuit thereby allowing activation of LASER activated fuses after an integrated circuit chip is flip-chip and/or MCM mounted.

SUMMARY OF THE INVENTION

According to the method of the invention, LASER activated fuses can be activated from the back-side of the integrated circuit chip, or from any surface of the integrated circuit chip, using multiple-photon absorption techniques that allow the absorbed LASER energy to be highly localized in three dimensions, thereby avoiding absorption in areas of the substrate other than the focal point. Thus, according to the invention, objects such as LASER activated fuses that lie either within the integrated circuit substrate, or on the opposite surface, i.e., the active surface, of the integrated circuit substrate can be accessed and activated by the LASER energy. Consequently, using the method of the invention, LASER activated fuses can be activated after the integrated circuit chip has been mounted in a flip-chip configuration and/or as part of an MCM module.

Since, using the method of the invention, LASER activated fuses can be activated after the integrated circuit chip has been mounted in a flip-chip configuration and/or as part of an MCM module, redundant repair circuitry can be accessed, and circuit repairs can be made, after the integrated circuit has been operationally mounted. As a result, by employing the method of the present invention, an integrated circuit chip can be tested, and repaired if necessary, from the chip backside after the integrated circuit chip has been operationally mounted in a flip-chip/MCM configuration just as it will be connected in the field. This means that, in contrast to the prior art, using the present invention, integrated circuit chips can be tested under realistic operating conditions, i.e., at realistic speeds and under realistic operating thermodynamics, since the actual connections that will be used in the field will have been made when the integrated circuit chip is tested.

In addition, using the method of the invention, any contamination and/or defects introduced in the packaging/mounting process can now be repaired after the integrated circuit chip is operationally mounted. In addition, using the present invention, there is no need for special test equipment required in the prior art to make temporary signal connections and partially test the integrated circuit chip to try to find defects prior to mounting.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 5:
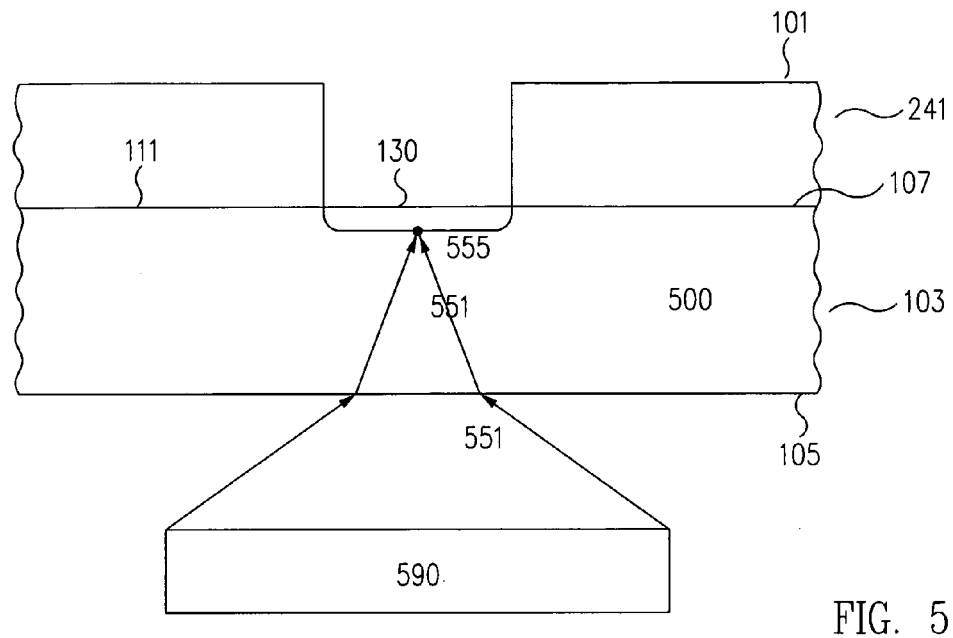
FIG. 5 shows a side view of an integrated circuit chip including a LASER activated fuse being blown from the backside of the integrated circuit chip by the LASER activation methods of the invention.
Figure 6:
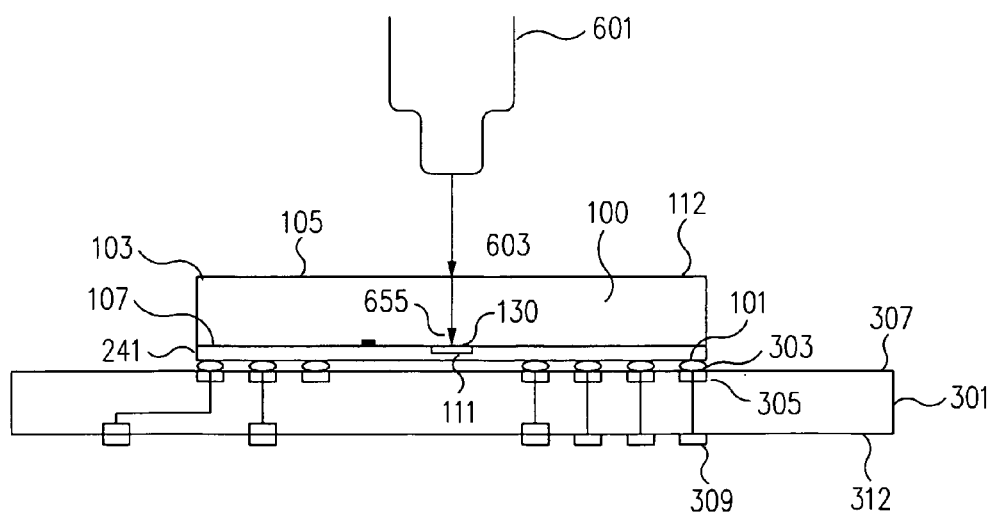
FIG. 6 shows an integrated circuit mounted in an integrated circuit package in a flip-chip configuration including a LASER activated fuse being blown from the backside of the integrated circuit chip by the LASER activation methods of the invention.

According to the method of the invention, LASER activated fuses (130 in FIGS. 1B, 2, 3, 5 and 6) can be activated from the back-side (105 in FIGS. 1B, 2, 3, 5 and 6) of the integrated circuit chip (100 in FIGS. 1B, 2, 3, 5 and 6) using multiple-photon absorption techniques that allow the absorbed LASER energy (551 in FIGS. 5 and 603 in FIG. 6) to be highly localized in three dimensions, thereby avoiding absorption in areas of the substrate other than the focal point (555 in FIGS. 5 and 655 in FIG. 6). Thus, according to the invention, objects such as LASER activated fuses that lie either within the integrated circuit substrate (103 in FIGS. 1B, 2, 3, 5 and 6), or on the opposite surface (111 in FIGS. 1B, 2, 3, 5 and 6), i.e., the active surface, of the integrated circuit substrate can be accessed and activated by the LASER energy. Consequently, using the method of the invention, LASER activated fuses can be activated after the integrated circuit chip has been mounted in a flip-chip configuration and/or as part of an MCM module.

Since, using the method of the invention, LASER activated fuses can be activated after the integrated circuit chip has been mounted in a flip-chip configuration and/or as part of an MCM module, redundant repair circuitry can be accessed, and circuit repairs can be made, after the integrated circuit has been operationally mounted. As a result, by employing the method of the present invention, an integrated circuit chip can be tested, and repaired if necessary, from the chip backside after the integrated circuit chip has been operationally mounted in a flip-chip/MCM configuration just as it will be connected in the field. This means that, in contrast to the prior art, using the present invention, integrated circuit chips can be tested under realistic operating conditions, i.e., at realistic speeds and under realistic operating thermodynamics, since the actual connections that will be used in the field will have been made when the integrated circuit chip is tested.

In addition, using the method of the invention, any contamination and/or defects introduced in the packaging/mounting process can now be repaired after the integrated circuit chip is operationally mounted. In addition, using the present invention, there is no need for special test equipment required in the prior art to make temporary signal connections and partially test the integrated circuit chip to try to find defects prior to mounting.

Figure 1A:
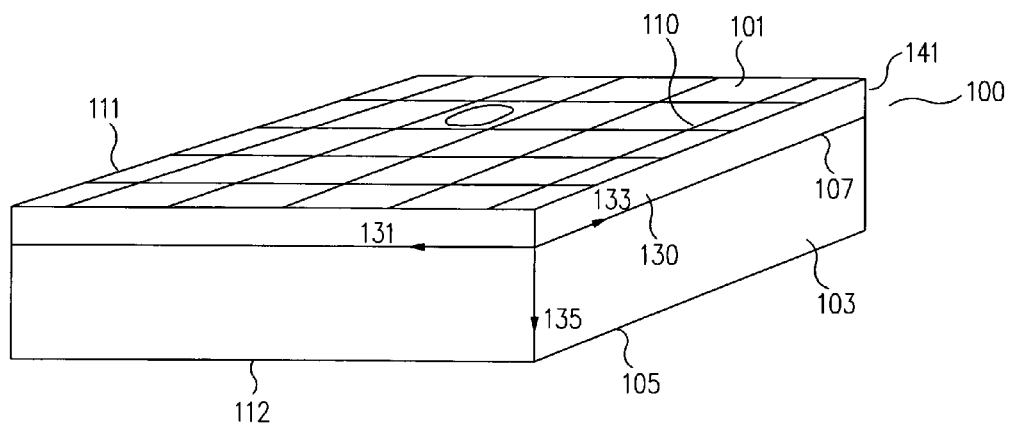
FIG. 1A shows a simplified perspective view of an integrated circuit chip 100.
Figure 1B:
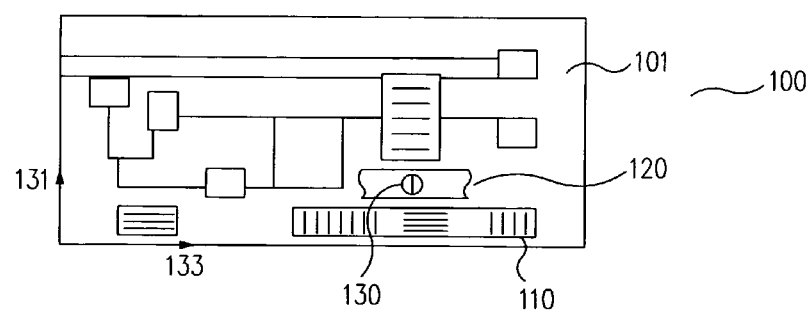
FIG. 1B shows a simplified overhead view of the active side of an integrated circuit chip including redundant repair circuitry and a LASER activated fuse.
Figure 2:
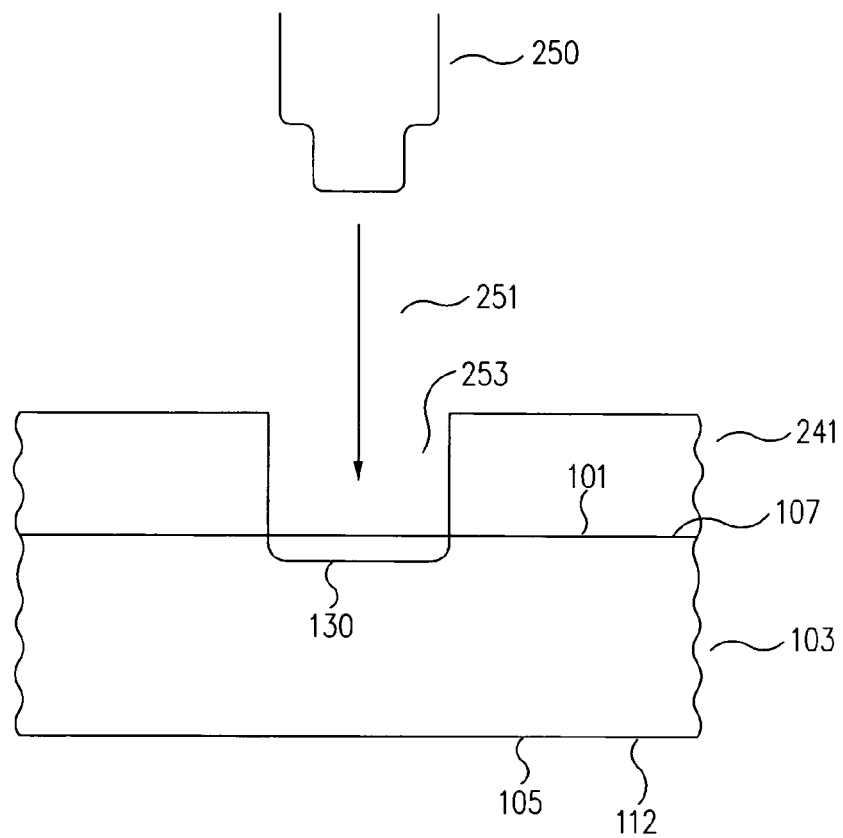
FIG. 2 shows a side view of an integrated circuit chip including a LASER activated fuse being blown from the active side of the integrated circuit chip by prior art LASER activation methods.
Figure 3:
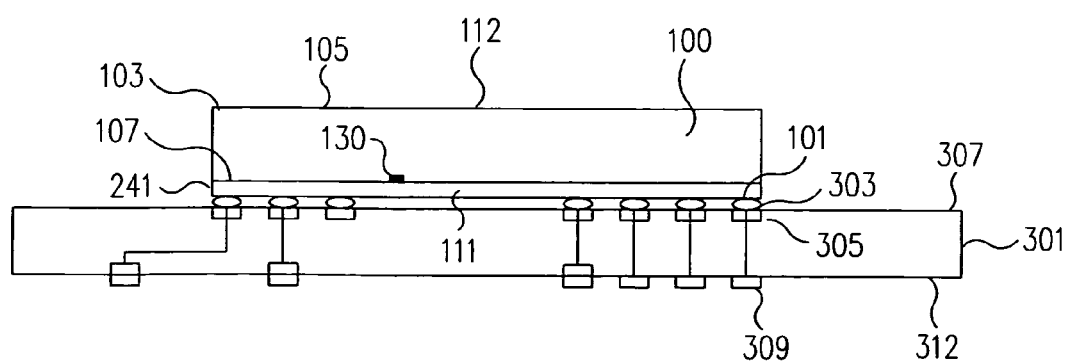
FIG. 3 shows an integrated circuit mounted in an integrated circuit package in a flip-chip configuration.
Figure 4:
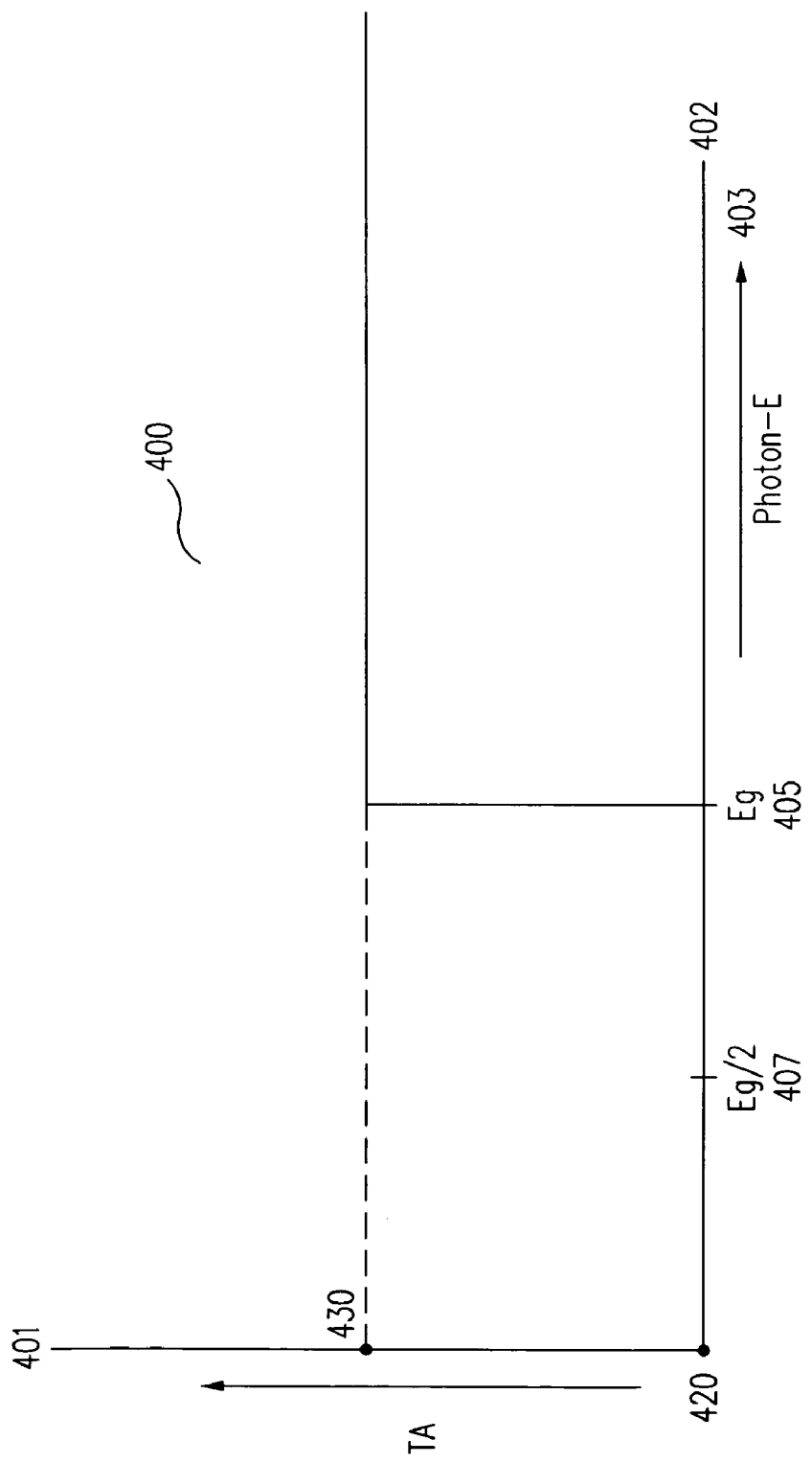
FIG. 4 shows a simplified graph of the absorption characteristics of a hypothetical semi-conducting material.

While not wishing to be overly bound by theory, the present invention requires a very basic and simplified understanding of multiple-photon absorption in solid-state materials. FIG. 4 is a highly simplified absorption graph for a hypothetical semi-conducting material having a band gap energy of Eg. FIG. 4 shows absorption TA along axis 401 versus photon energy E along axis 402, i.e., the frequency of the light times Planck's constant h. For a given semi-conducting material, such as, for example, the silicon substrate typically used for integrated circuit chips, there is a band gap energy Eg that determines absorption of light energy for that material. As shown in FIG. 4, light with a photon energy less than Eg has an absorption of virtually zero, point 420 in FIG. 4, while light with a photon energy of Eg or greater has an absorption of 1, or full absorption, point 430 in FIG. 4, assuming material of sufficient thickness, i.e., of order of several absorption lengths or more. In the prior art, single photon absorption was assumed and used so that the LASER energy 251 from LASER 253 (FIG. 2) was comprised of photons having energy Eg or greater for the material of the substrate 103 in order to activate LASER activated fuse 130. Consequently, referring to FIG. 4, LASER 251 of FIG. 2 was operated in the range from point 405 to the right (direction 403). As noted above, this resulted in the LASER energy being readily absorbed at the active surface 107 and by substrate 103 of integrated circuit chip 101 (FIGS. 1A, 1B and 2). Consequently, as discussed above, LASER activated fuse 130, had to be activated, i.e., either annealed or blown, from active side 111 of integrated circuit chip 100 so that an optical path could be guaranteed for the LASER energy to access and focus on LASER activated fuse 130.

The present invention relies on multiple-photon absorption. Multiple-photon absorption is well known in the art and a discussion of multiple-photon absorption can be found in any standard solid-state physics text or optics text. However, to help provide a better understanding of the invention, a short, simplified, and generalized discussion of multiple-photon absorption will follow. In multiple-photon absorption, an atom, or a solid composed of atoms, absorbs more than one photon simultaneously so long as the combined energy of the photons is Eg or greater. Multiple-photon absorption has been observed in all states of matter and therefore has moved from a theoretical prediction into an accepted phenomenon in the past several decades. Unlike single photon absorption, and because multiple-photon absorption requires almost simultaneous arrival of multiple photons at the site of absorption, multiple-photon absorption is a non-linear effect and is highly dependent on the intensity and point of focus. In general, the probability of "n" photons being absorbed is equal to a proportionality function S(n) times the intensity of the beam to the nth power $I^n$ that is:

$$PA(n)=S(n)\ I^n$$

In addition, S(n) typically decreases significantly with n.

The present invention uses the fact that the total absorption of multiple-photon energy is a non-linear function of the intensity to focus the absorbed energy in three dimensions. According to the invention, a LASER is used to emit photons of a predetermined frequency such that the photons have an energy greater than Eg/n, but less than Eg/(n−1) for the substrate material, typically a semiconductor material such as silicon. The LASER energy is then emitted at an intensity such that only at the focal point of the beam is the intensity I, or more importantly $I^n$, great enough to create a finite probability of n-photon absorption. Consequently, LASER energy sufficient to activate a fuse, or damage the silicon substrate, is absorbed only at the focal point, i.e., the LASER activated fuse, and the intervening substrate is left unaffected.

In one example, the invention relies on two-photon absorption. Consequently, in this embodiment of the invention, the general relationship above for the probability of multiple-photon absorption becomes:

$$PA(2)=S(2)\ I^2$$

In this example, a LASER (not shown) is used to emit photons of a predetermined frequency such that the photons have an energy greater than Eg/2, point 407 in FIG. 4, but less than Eg, point 405 in FIG. 4 for the substrate material, typically a semiconductor material such as silicon. It is important to note that for the specific example of two-photon absorption, the individual photons must have an energy of at least Eg/2, so that two photons combined will have at least the required energy Eg, and that the individual photons must have an energy less than Eg, so that no single-photon absorption can take place.

While a specific example of two-photon absorption is discussed above, those of skill in the art will readily recognize that the theory and principles of the invention can be readily applied to 3-, 4- or "n-" photon absorption by using the relationship $$PA(n)=S(n)\ I^n$$

and ensuring that LASER is used to emit photons of a predetermined frequency such that the photons have an energy greater than Eg/n but less than Eg/(n−1) for the substrate material.

As discussed above, according to the present invention, the LASER energy is emitted at an intensity such that only at the focal point of the beam is the intensity I, or more importantly $I^n$, great enough to create a finite probability of n-photon absorption. Consequently, LASER energy sufficient to activate a fuse, or damage the silicon substrate, is absorbed only at the focal point, i.e., the LASER activated fuse, and the intervening substrate is left unaffected. Of course, for the purposes of the invention, i.e., activating a LASER activated fuse, the focal point is located at the fuse itself. Obviously, those of skill in the art will recognize that the focal point must be adjusted by means well known to those of skill in the art such that it lies on or in the LASER activated fuse. Of course, this adjustment will vary depending on the thickness of the substrate and the location of the LASER activated fuse. However, adjusting a LASER's focal point, calculating a LASER's intensity, and adjusting a LASER's frequency are skills well known to those of skill in the art and are therefore not discussed in detail herein to avoid detracting from the present invention.

FIG. 5 shows a side view of a portion 500 of an integrated circuit chip 101 including a LASER activated fuse 130 being activated from the backside surface 105 of the integrated circuit chip substrate 103 by the multiple-photon LASER activation methods of the invention. As shown in FIG. 5, according to the present invention, the well-known multiple-photon absorption capabilities of matter in all its states, in this case the solid state, is used to highly localize the absorption of LASER energy 551 in three dimensions at point 555 in LASER activated fuse 130. Consequently, according to the invention, LASER activated fuse 130 is activated without significant interaction with the rest of substrate 103 of integrated circuit chip 101. As shown symbolically in FIG. 5, LASER energy 551 from a focusing LASER 590 is emitted at an intensity such that only at the focal point 555 of the focused beam 551 is the intensity I, or more importantly $I^n$, great enough to create a finite probability of n-photon absorption. In addition, for completeness, but not relevant to the principles of the present invention, LASER energy 551 is shown refracted by substrate 103 at backside surface 105 according to the properties of light and solids expressed in the well-known relationship called Snell's law.

As discussed above, the prior art assumed and used single photon absorption and the LASER energy 251 from LASER 253 (FIG. 2) was comprised of photons having energy Eg or greater for the material of the substrate 103 in order to activate LASER activated fuse 130. Consequently, LASER 251 was operated in the range from point 405 to the right in FIG. 4. As noted above, this resulted in the LASER energy being readily absorbed at the active surface 107 and by substrate 103 of integrated circuit chip 101. Consequently, as discussed above, LASER activated fuse 130, had to be activated, i.e., either annealed or blown, from active side 111 of integrated circuit chip 100 so that an optical path could be guaranteed for the LASER energy to access and focus on LASER activated fuse 130.

In contrast, the present invention, as shown in FIG. 5, uses the fact that the total absorption of multiple-photon energy is a non-linear function of the intensity to focus the absorbed energy in three dimensions at point 555 of LASER activated fuse 130 from backside surface 105 of integrated circuit chip substrate 103. According to the invention, LASER energy 551 is emitted at an intensity such that only at the focal point 555 of the beam 551 is the intensity I, or more importantly $I^n$, great enough to create a finite probability of n-photon absorption. Consequently, LASER energy sufficient to activate LASER activated fuse 130, or damage silicon substrate 103, is absorbed only at focal point 555, i.e., LASER activated fuse 130, and the intervening substrate 103 is left unaffected.

Consequently, using the method of the invention, LASER activated fuses 130 can be activated after the integrated circuit chip 100 has been mounted in a flip-chip configuration and/or as part of an MCM module. FIG. 6 shows an integrated circuit chip 100 mounted in an integrated circuit package in a flip-chip configuration including a LASER activated fuse being blown from the backside of the integrated circuit chip by the LASER activation methods of the invention.

While the current practice of flip-chip mounting and MCMs in the relevant art benefits from using the present invention to access the integrated circuit chip from the backside, those of skill in the art will also readily recognize that the methods of the present invention can be used to access any point within, or on, any surface of integrated circuit chip 100 as directed by the needs of the user. In addition, using the method of the invention, any target point or structure within integrated circuit chip 100 can be accessed from any surface of integrated circuit chip 100 including, but not limited to, the active surface, a passivation surface or side surface of integrated circuit chip 100.

As shown in FIG. 6, when mounted in a flip-chip configuration, active side 111 of integrated circuit chip 100 includes solder mounting bumps 303 that are coupled to mounting pads 305 that are formed on first surface 307 of mounting substrate 301. Mounting Pads 305 are, in turn, coupled to connection pads 309 on second surface 312 of mounting substrate 301. Connection pads 309 are then used to couple the structure of FIG. 6 to a motherboard or other larger unit.

Importantly, as shown in FIG. 6, once integrated circuit chip 100 is flip-chip mounted to mounting substrate 301, i.e., once integrated circuit chip 100 is operational connected as it will be used in the field, there is no optically direct access to active side 111 of integrated circuit chip 100 or to active surface 107 and LASER activated fuse 130. Consequently, using prior art methods, LASER activated fuse 130 could not be activated once integrated circuit chip 100 was connected as it would be used. This meant that integrated circuit chip 100 could not be tested under its actual operating conditions and that special test equipment had to be used to try to find defects prior to mounting integrated circuit chip 100 because post-mounting defects could not be corrected.

In contrast, as shown in FIG. 6, using the method of the present invention, LASER activated fuse 130 is activated from the back-side 105 of the integrated circuit chip substrate 103 by LASER 601 and the multiple-photon LASER activation methods of the invention. As shown in FIG. 6, according to the present invention, multiple-photon absorption is used to allow the LASER energy 603 to be highly localized in three dimensions at point 655 in LASER activated fuse 130, thereby activating LASER activated fuse 130 without significantly interacting with the rest of substrate 103 of integrated circuit chip 101.

Since, using the method of the invention, LASER activated fuses can be activated after the integrated circuit chip has been mounted in a flip-chip configuration and/or as part of an MCM module repair, redundant repair circuitry can be accessed, and circuit repairs can be made, after the integrated circuit has been operationally mounted. As a result, by employing the method of the present invention, an integrated circuit chip can be tested, and repaired if necessary, from the chip back-side after the integrated circuit chip has been operationally mounted in a flip-chip/MCM configuration just as it will connected in the field. This means that, in contrast to the prior art, using the present invention, integrated circuit chips can be tested under realistic operating conditions, i.e., at realistic speeds and under realistic operating thermodynamics, since the actual connections that will be used in the field will have been made when the integrated circuit chip is tested.

In addition, using the method of the invention, any contamination and/or defects introduced in the packaging/mounting process can now be repaired after the integrated circuit chip is operationally mounted. In addition, using the present invention, there is no need for special test equipment required in the prior art to make temporary signal connections and partially test the integrated circuit chip to try to find defects prior to mounting.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For instance, while a specific example of two-photon absorption is discussed in detail above, those of skill in the art will readily recognize that the theory and principles of the invention can be readily applied to 3-, 4- or "n-" photon absorption by using the relationship $$PA(n) = S(n) \, I^n$$

and ensuring that LASER is used to emit photons of a predetermined frequency such that the photons have an energy greater than Eg/n but less than Eg/(n−1) for the substrate material.

In addition, while the current practice of flip-chip mounting and MCMs in the relevant art benefits form using the present invention to access the integrated circuit chip from the backside, those of skill in the art will also readily recognize that the methods of the present invention can be used to access any point within, or on, any surface of integrated circuit chip 100 as directed by the needs of the user. In addition, using the method of the invention, any target point or structure within integrated circuit chip 100 can be accessed from any surface of integrated circuit chip 100 including, but not limited to, the active surface, a passivation surface or side surface of integrated circuit chip 100.

Consequently, the scope of the invention is defined by the claims and their equivalents.

What is claimed is:

1. A method for repairing a non-functioning integrated circuit comprising:
   providing an integrated circuit chip, said integrated circuit chip comprising an integrated circuit chip active surface, said integrated circuit chip active surface being formed on a first surface of a substrate, said substrate having a substrate backside surface, said substrate backside surface being opposite said substrate first surface, said substrate having a substrate band-gap energy;
   providing redundant repair circuitry in said integrated circuit chip active surface to replace any failed circuitry in said integrated circuit chip active surface;
   forming a fuse in said integrated circuit chip active surface, said fuse for connecting said redundant repair circuitry to circuitry formed in said integrated circuit active surface, said fuse being activated by LASER energy, said LASER energy being comprised of photons, each photon having a predetermined photon energy, said photon energy being less than said substrate band-gap energy;

activating said fuse in said integrated circuit chip active surface by directing said LASER at said substrate backside surface and focusing said LASER energy such that an intensity of said LASER energy at said fuse causes multiple-photon absorption by said fuse, said fuse thereby connecting said redundant repair circuitry to said circuitry formed in said integrated circuit active surface.

2. The method for repairing a non-functioning integrated circuit of claim 1, wherein;
said activating said fuse in said integrated circuit chip active surface by directing said LASER at said substrate backside surface and focusing said LASER energy such that an intensity of said LASER energy at said fuse causes multiple-photon absorption by said fuse and causes said fuse to be annealed.

3. The method for repairing a non-functioning integrated circuit of claim 2, wherein;
said predetermined photon energy is less than said substrate band-gap energy but greater than one-half said substrate band-gap energy.

4. The method for repairing a non-functioning integrated circuit of claim 2, wherein;
said predetermined photon energy is less than half said substrate band-gap energy but greater than one-third said substrate band-gap energy.

5. The method for repairing a non-functioning integrated circuit of claim 2, wherein;
said predetermined photon energy is less than said substrate band-gap energy divided by "n−1" but greater than said substrate band-gap energy divided by "n", where "n" is the number of photons that must be nearly simultaneously absorbed by said fuse to anneal said fuse and where "n" is an integer equal to or larger than two.

6. The method for repairing a non-functioning integrated circuit of claim 2, wherein;
said fuse electrically couples a repair circuit to said integrated circuit.

7. The method for repairing a non-functioning integrated circuit of claim 2, wherein;
said fuse electrically bypasses a defective circuit in said integrated circuit.

8. The method for repairing a non-functioning integrated circuit of claim 1, wherein;
said activating said fuse in said integrated circuit chip active surface by directing said LASER at said substrate backside surface and focusing said LASER energy such that an intensity of said LASER energy at said fuse causes multiple-photon absorption by said fuse and causes said fuse to be ablated.

9. The method for repairing a non-functioning integrated circuit of claim 8, wherein;
said predetermined photon energy is less than said substrate band-gap energy but greater than one-half said substrate band-gap energy.

10. The method for repairing a non-functioning integrated circuit of claim 8, wherein;
said predetermined photon energy is less than half said substrate band-gap energy but greater than one-third said substrate band-gap energy.

11. The method for repairing a non-functioning integrated circuit of claim 8, wherein;
said predetermined photon energy is less than said substrate band-gap energy divided by "n−1" but greater than said substrate band-gap energy divided by "n", where "n" is the number of photons that must be nearly simultaneously absorbed by said fuse to ablate said fuse and where "n" is an integer equal to or larger than two.

12. The method for repairing a non-functioning integrated circuit of claim 8, wherein;
said fuse electrically couples a repair circuit to said integrated circuit.

13. The method for repairing a non-functioning integrated circuit of claim 8, wherein; said fuse electrically bypasses a defective circuit in said integrated circuit.

* * * * *